United States Patent
Campbell et al.

(10) Patent No.: US 10,405,459 B2
(45) Date of Patent: Sep. 3, 2019

(54) ACTUATED IMMERSION COOLED ELECTRONIC ASSEMBLIES

(71) Applicant: Hamilton Sundstrand Corporation, Charlotte, NC (US)

(72) Inventors: Kris H. Campbell, Poplar Grove, IL (US); Charles Shepard, DeKalb, IL (US); Shin Katsumata, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 255 days.

(21) Appl. No.: 15/228,842

(22) Filed: Aug. 4, 2016

(65) Prior Publication Data
US 2018/0042138 A1 Feb. 8, 2018

(51) Int. Cl.
*H05K 7/20* (2006.01)

(52) U.S. Cl.
CPC ..................... *H05K 7/203* (2013.01)

(58) Field of Classification Search
CPC . H05K 7/20236; H05K 7/20272; H05K 7/203
See application file for complete search history.

(56) References Cited

U.S. PATENT DOCUMENTS

| | | | |
|---|---|---|---|
| 4,385,909 A * | 5/1983 | Starr | F15B 21/044 210/188 |
| 4,700,272 A | 10/1987 | Bellamy | |
| 5,206,791 A | 4/1993 | Novotny | |
| 5,373,417 A * | 12/1994 | Barrett | H01L 23/42 165/80.4 |
| 2011/0048345 A1 * | 3/2011 | Popadiuc | F01P 11/029 123/41.04 |
| 2014/0071625 A1 | 3/2014 | Luo et al. | |
| 2014/0218859 A1 * | 8/2014 | Shelnutt | G06F 1/206 361/679.46 |
| 2016/0023843 A1 * | 1/2016 | Donahue | B65D 88/78 405/210 |
| 2016/0165748 A1 * | 6/2016 | Chen | B23P 15/26 165/46 |
| 2016/0247622 A1 * | 8/2016 | Bjoerkhaug | H01F 27/16 |
| 2016/0345461 A1 * | 11/2016 | Smith | H05K 5/0017 |
| 2017/0064862 A1 * | 3/2017 | Miyoshi | H05K 7/203 |

FOREIGN PATENT DOCUMENTS

| | | |
|---|---|---|
| CN | 105491849 A | 4/2016 |
| GB | 8451020 A | 8/1960 |

* cited by examiner

*Primary Examiner* — Anthony M Haughton
*Assistant Examiner* — Yahya Ahmad
(74) *Attorney, Agent, or Firm* — Locke Lord LLP; Scott D. Wofsy; Joshua L. Jones

(57) ABSTRACT

An immersion cooled electronics arrangement includes a housing containing a coolant, an electronic device submerged within the housing and in thermal communication with the coolant, and a variable volume body. The variable volume body is disposed within the housing. An actuator is operatively connected to the variable volume body and is arranged to displace coolant within the housing.

18 Claims, 4 Drawing Sheets

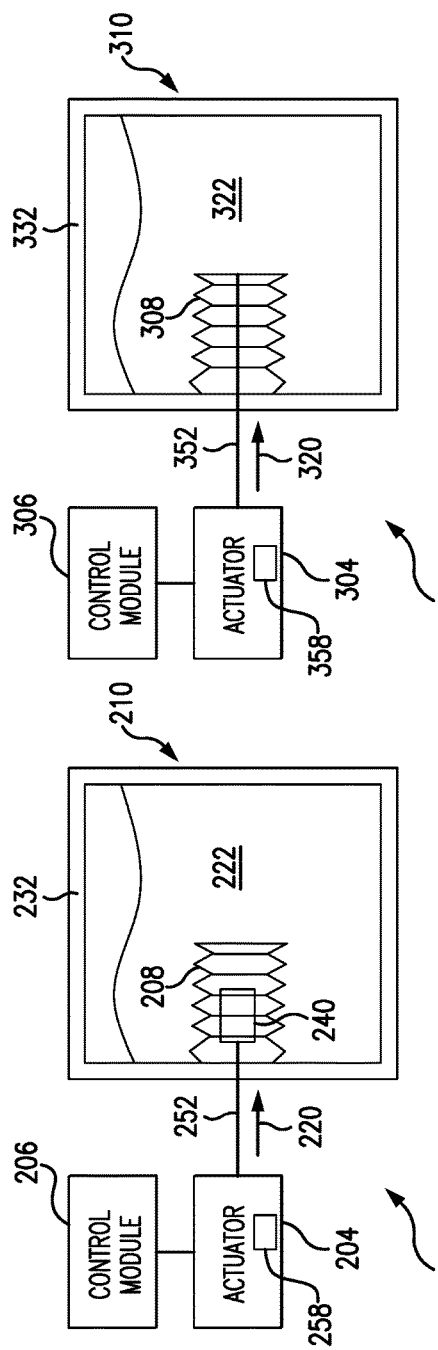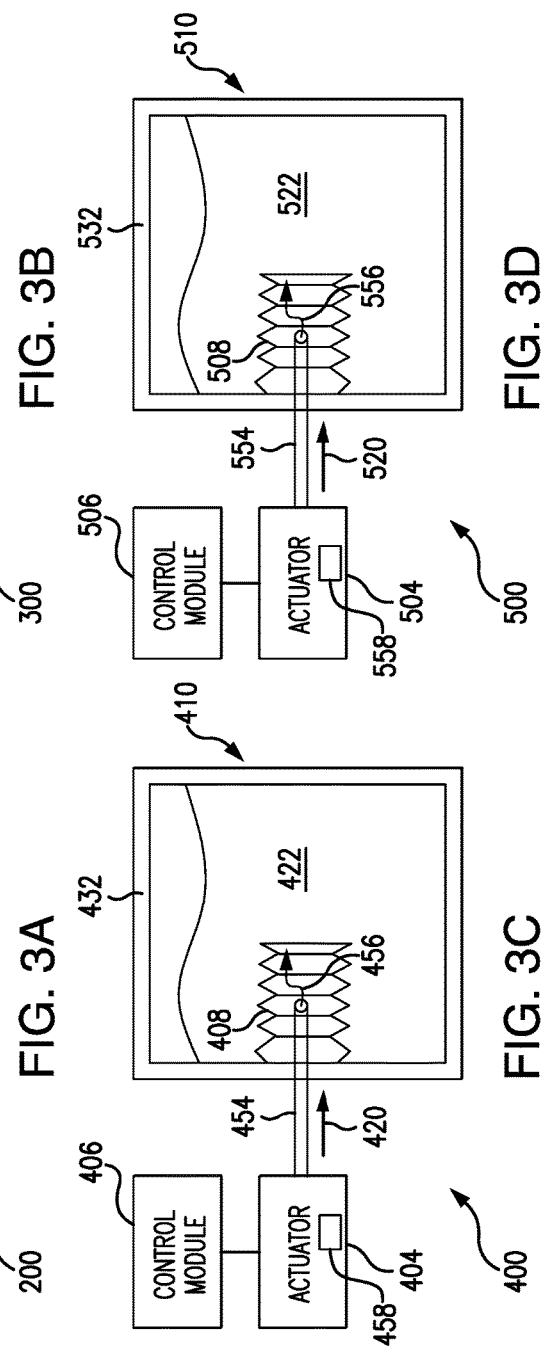

ACTUATED IMMERSION COOLED ELECTRONIC ASSEMBLIES

BACKGROUND OF THE INVENTION

1. Field of the Invention

The present disclosure relates to electrical systems, and more particularly to heat removal from electronics in electrical systems.

2. Description of Related Art

Throughout the aerospace industry the electrical power requirements of modern aircraft are steadily increasing. These increased power requirements, in conjunction with the harsh operating environments aircraft typically experience, create a demand for higher power density electronic devices. Electrical power applied to higher power density electronics can be accompanied by relatively high rates of heat generation from resistive heating of electrical components, which must be managed within the device and removed from such devices in order to ensure reliable operation of such devices.

Several cooling techniques may be employed by such electrical systems to remove heat from electrical devices. Examples of cooling arrangements include conduction cooling, natural convection cooling, radiation cooling, forced-air cooling, and liquid cooling. Increasing power density has led to interest in immersion cooling in certain applications, where a liquid is typically placed in direct contact with an electronic device. Immersion cooling typically requires that the container housing a liquid coolant have sufficient mechanical robustness to withstand stress associated with pressure change of the liquid within the container from heating.

Such conventional methods and systems have generally been considered satisfactory for their intended purpose. However, there is still a need in the art for improved immersion cooling systems. The present disclosure provides a solution for this need.

SUMMARY OF THE INVENTION

An immersion cooled electronics arrangement includes a housing containing a coolant, an electronic device submerged within the housing and in thermal communication with the coolant, and a variable volume body. The variable volume body is disposed within the housing. An actuator is operatively connected to the variable volume body and is arranged to displace coolant within the housing by increasing or decreasing a volume occupied by the variable volume body.

In certain embodiments, the variable volume body can be submerged within the coolant. The actuator can be disposed outside of the housing. The actuator can be in electrical communication, mechanical communication, pneumatic communication, or hydraulic communication with the variable volume body. One or more of an electrical conductor, a linkage, a pneumatic conduit, and a hydraulic conduit can extend from the housing interior, through the housing, and to the variable volume body to connect the actuator with the variable volume body.

In accordance with certain embodiments, the coolant can include a dielectric coolant. The coolant can be fluidly isolated from the external environment by the housing. The variable volume body can include a bellows. An ullage space can be defined between the coolant and the housing. A condenser can be disposed within the ullage space. The electronic device can include one or more of a capacitor, an inductor, a printed circuit board, a solid-state switch device, and a solid-state power converter.

It is also contemplated that, in accordance with certain embodiments, a control module can be communicative with the actuator. The control module can be arranged to cause the actuator to change a volume of coolant displaced by the variable volume body within the housing. The control module can be arranged to change the volume of coolant displaced by the variable volume body according to one or more of temperature, pressure, and current flow. A sensor can be communicative with the interior of the housing. The sensor can be arranged to provide an indication of one or more parameter of the environment within the interior of the housing including temperature, pressure, and/or liquid level.

A cooling system includes an immersion cooling arrangement as described above. A control module is communicative with the actuator and a sensor is arranged to provide a parameter of the coolant to the control module. The control module is response to instructions recorded on a non-transitory machine-readable medium to determine a parameter of the coolant and compare the determined parameter with a predetermined parameter target. Based on the comparison the control module changes change a volume of coolant displaced by the variable volume body based on the comparison using the actuator.

A method of transferring heat between a coolant and an electronic device in an immersion cooling arrangement includes determining a parameter of the coolant. The determined parameter is compared with a predetermined parameter target. Based on the comparison a volume of coolant displaced by the variable volume body is increased or decreased when mismatch between the determined parameter and parameter is outside of a threshold. The volume of coolant displaced by the variable volume body can be maintained when mismatch is within the threshold.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIGS. 3A-3D are schematic views of embodiments of the cooling system of FIG. 1, showing actuators in electrical, mechanical, pneumatic, and hydraulic communication with the variable volume body, respectively.

DETAILED DESCRIPTION OF THE PREFERRED EMBODIMENTS

Figure 1:
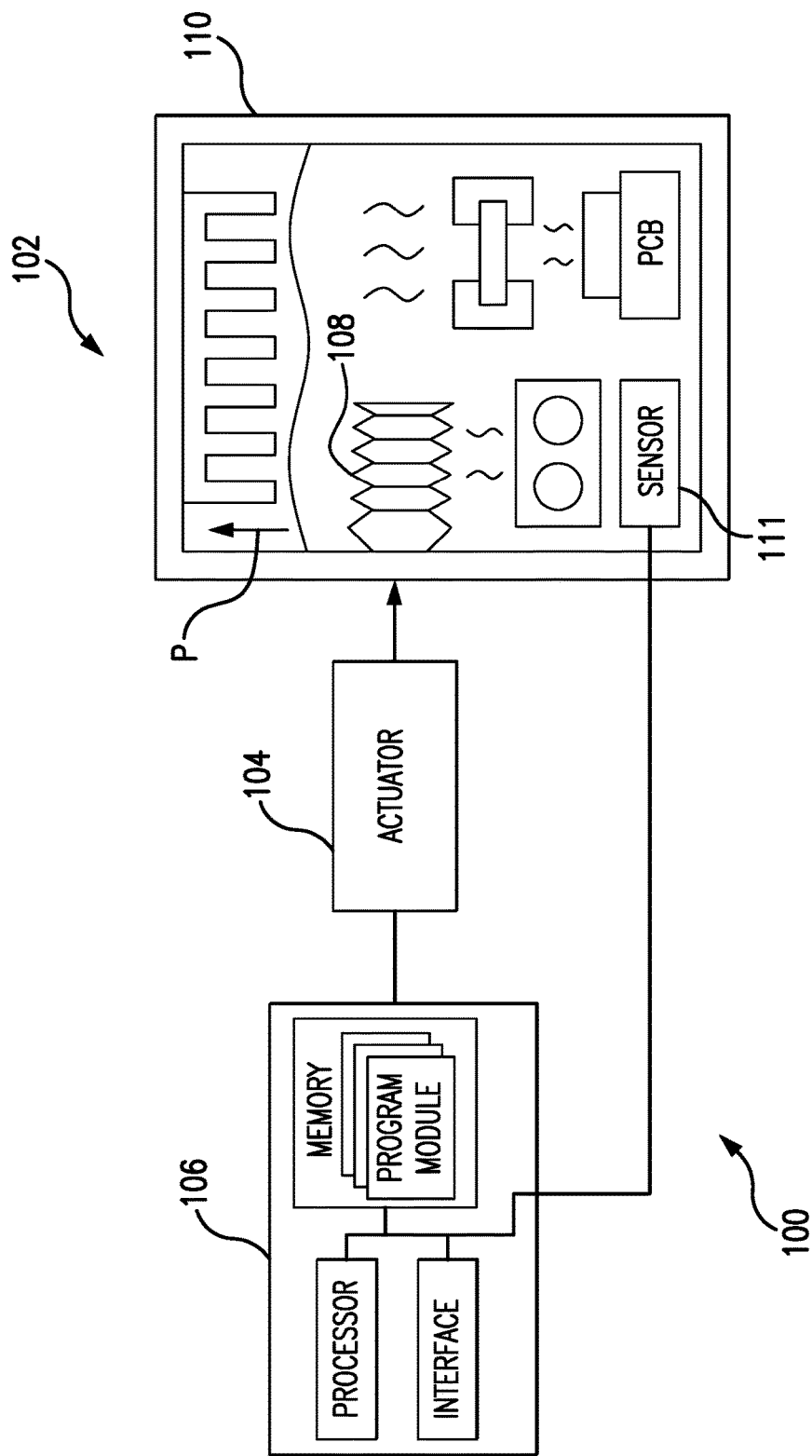
FIG. 1 is a schematic view of an exemplary embodiment of a cooling system constructed in accordance with the present disclosure, showing an actuator arranged outside an immersion cooled electronics arrangement and operatively connected to a variable volume body within a housing of immersion cooled electronics arrangement.

Reference will now be made to the drawings wherein like reference numerals identify similar structural features or aspects of the subject disclosure. For purposes of explanation and illustration, and not limitation, a partial view of an exemplary embodiment of a cooling system in accordance with the disclosure is shown in FIG. 1 and is designated generally by reference character 100. Other embodiments of cooling systems, immersion cooling arrangements, and methods of transferring heat between coolant and electronic devices in immersion cooling arrangements in accordance with the disclosure, or aspects thereof, are provided in FIGS. 2-4, as will be described. The systems and methods described herein can be used in for cooling motor controllers in aircraft electrical systems, though the present disclosure is not limited motor controllers or to aircraft electrical systems in general.

Referring to FIG. 1, cooling system 100 is shown. Cooling system 100 includes an immersion cooled electronics arrangement 102, an actuator 104, and a control module 106. Immersion cooled electronics arrangement 102 includes a variable volume body 108 disposed within a housing 110. Actuator 104 is disposed outside of housing 110 and is operatively connected to variable volume body 108 to change a volume occupied by variable volume body 108 within housing 110. Control module 106 is communicative with actuator 104 and is connected to a sensor 111 arranged to provide a parameter of the coolant to control module 106. Based on the parameter provided by sensor 111, control module 106 determines a parameter of the coolant, compares the determined parameter with a predetermined parameter target, and changes a volume of coolant displaced by variable volume body 108 based on the comparison using actuator 104.

Figure 2:
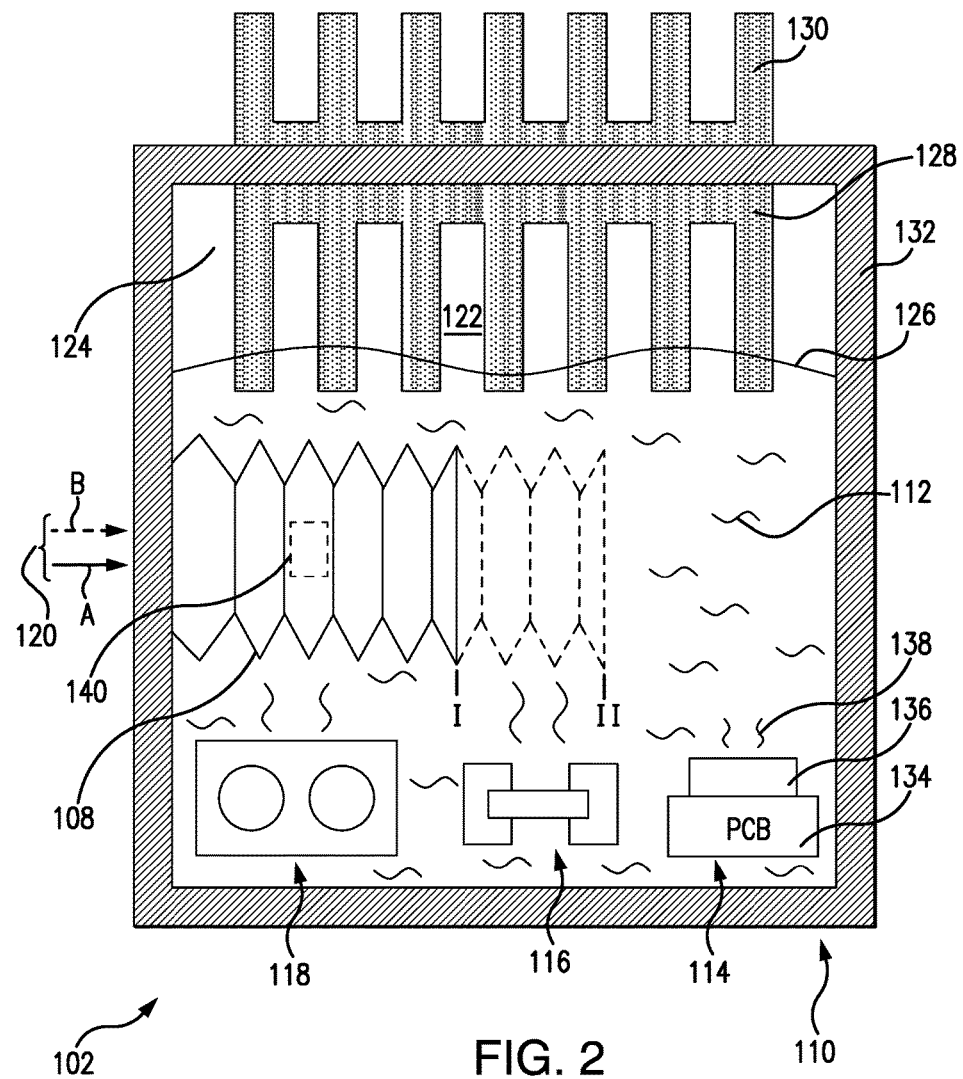
FIG. 2 is a schematic view of the immersion cooled electronics arrangement of FIG. 1, showing elements of the immersion cooled electronics arrangement and actuator causing the variable-volume chamber to displace different amounts of coolant within the housing.

With reference to FIG. 2, immersion cooled electronics arrangement 102 is shown. Immersion cooled electronics arrangement 102 includes housing 110 and a coolant 112 contained within housing 110. One or more electronic devices are disposed within housing 110 and submerged within coolant 112. In the illustrated exemplary embodiment a printed circuit board (PCB) arrangement 114, an inductor 116, and a capacitor 118 are disposed within housing 110, and are submerged within coolant 112.

Housing 110 can be sealed with respect to the external environment, thereby separating coolant 112 from the external environment. Housing 110 can define within an interior 122a fixed volume. In certain embodiments it is contemplated that housing 110 can define a variable volume, expanding or contracting above and below predetermined pressures within interior 122.

Coolant 112 is electrically insulative, thermally conductive coolant, and may include a dielectric coolant. Examples of suitable coolants include fluorocarbons, such as perfluorohexane (FC-72), perfluoro (FC-75), and/or perfluorotripentylamine (FC-70). FC-72, FC-75, and FC-70 are available under the tradename Flourinert® from the 3M Company of Maplewood, Minn.

A portion of coolant 112 in a liquid phase is disposed within a lower (relative to the direction of gravity) portion of the interior of housing 110. A portion of coolant 112 in a vapor phase is disposed within an ullage space 124 in an upper (relative to the direction of gravity) portion of the interior of housing 110. A surface 126 of the liquid phase of coolant 112 bounds ullage space 124, separating liquid phase coolant from vapor phase coolant contained within housing 110. As will be appreciated by those of skill in the art in view of the present disclosure, the relative proportion of liquid phase coolant to vapor phase coolant is a function by the temperature of coolant 112 and internal pressure P (shown in FIG. 1) within housing 110.

A condenser 128 is disposed within ullage space 124. Condenser 128 is in thermal communication with a heat exchanger 130 through a wall 132 of sealed housing 110, heat exchanger 130 being disposed on an exterior of housing 110 opposite condenser 128. Condenser 128 and heat exchanger 130 each have a plurality of fins for purposes of providing increased surface area for heat transfer, and as illustrated include discrete finned bodies connected to housing 110.

In the illustrated exemplary embodiment PCB arrangement 114 includes a printed circuit board 134 and one or more solid-state switch devices 136. The one or more solid-state switch device 136 is connected to a surface of PCB arrangement 114 and includes a field effect transistor, e.g., a MOSFET, or an insulated gate bipolar transistor (IGBT) device. PCB arrangement 114, inductor 116, and capacitor 118 generate heat 138 when power is applied from resistive heating, which is transferred between the respective electronics component and coolant 112. Coolant 112 in turn conveys heat 138 into condenser 128. Condenser 128 conducts heat 138 through wall 132 and into heat exchanger 130. Heat exchanger 130 dissipates heat 138 into the ambient environment.

Variable-volume body 108 is an elastic structure sealed with respect to interior 122 of housing 110. Variable-volume body 108 is also disposed within housing 110, is submerged within coolant 112, and is arranged to displace a differential volume of coolant in response to an actuator input 120 received from actuator 104. For example, variable-volume body 108 displaces a first volume of coolant I (shown in solid outline) in response to a first input A (shown as a solid arrow); variable-volume body 108 displaces a second volume of coolant II (shown in dashed outline) in response to a second input B (shown as a dashed arrow). In the illustrated exemplary embodiment variable-volume body 108 includes a bellows. It is contemplated that the illustrated bellows can be constructed from a metallic material such as aluminum, steel, or alloys thereof. In certain embodiments, a reflexive element 140, such as a spring, is disposed within variable-volume body 108 to bias a volume of fluid displaced by variable-volume body 108 a predetermined volume.

With reference to FIGS. 3A-3D, cooling systems 200-500 are shown. Referring to FIG. 3A, a cooling system 200 is shown. Cooling system 200 is similar to cooling system 100 and additionally an actuator 204 in electrical communication, with a variable-volume body 208, e.g., using an electrical input 220. In this respect an electrical conductor 252 extends from actuator 204, through wall 232 of housing 210, and into an interior of variable-volume body 208. Within interior 222 electrical conductor 252 is connected to element 240, which may be a piezoelectric element, which expands and contracts variable-volume body 208 between first displacement I (shown in FIG. 2) and second displacement II (shown in FIG. 2) in response to electrical input 220. Actuator 204 may include a voltage source 258 for applying voltage to element 240 response to an input received from control module 206.

Referring to FIG. 3B, a cooling system 300 is shown. Cooling system 300 is similar to cooling system 100 and additionally an actuator 304 in mechanical communication with a variable-volume body 308, e.g., using a mechanical input 320 or movement. In this respect a mechanical linkage 352 extends from actuator 304, through wall 332 of housing 310, and into an interior of variable-volume body 308. Within interior 322 mechanical linkage 352 is connected variable-volume body 308. Mechanical linkage 352 expands and contracts variable-volume body 308 between first displacement I (shown in FIG. 2) and second displacement II (shown in FIG. 2) in response to mechanical input 320, which may be a force exerted axially along a length of mechanical linkage 352. Actuator 304 may include a motor 358 or other suitable motive device operatively connected to a controller 306 to apply a motive force to mechanical linkage 352.

Referring to FIG. 3C, a cooling system 400 is shown. Cooling system 400 is similar to cooling system 100 and additionally has an actuator 404 in pneumatic communication with a variable-volume body 408, e.g., using a pneumatic input 420. In this respect a pneumatic conduit 454 extends from actuator 404, through wall 432 of housing 410, and into an interior of variable-volume body 408. A gas 456 issues from or is drawn into pneumatic conduit 454 by operation of actuator 404, thereby expanding and contracting variable-volume body 408 between first displacement I (shown in FIG. 2) and second displacement II (shown in FIG. 2) in response to pneumatic input 420. It is contemplated that the actuator 404 may include a pump or a gas source 458 operatively connected to a controller 406 to force gas through pneumatic conduit 454 and into interior 422 to generate pneumatic input 420.

Referring to FIG. 3D, a cooling system 500 is shown. Cooling system 500 is similar to cooling system 100 and additionally an actuator 504 in hydraulic communication, with a variable-volume body 508, e.g., using a hydraulic input 520. In this respect a hydraulic conduit 554 extends from actuator 504, through wall 532 of housing 510, and into an interior of variable-volume body 508. A liquid 556 issues from or is drawn into hydraulic conduit 554 by operation of actuator 504, thereby expanding and contracting variable-volume body 508 between first displacement I (shown in FIG. 2) and second displacement II (shown in FIG. 2) in response to hydraulic input 520. It is contemplated that the actuator 504 may include a pump 558 to drive a liquid 556, e.g., water or dielectric fluid, through hydraulic conduit 554.

Figure 4:
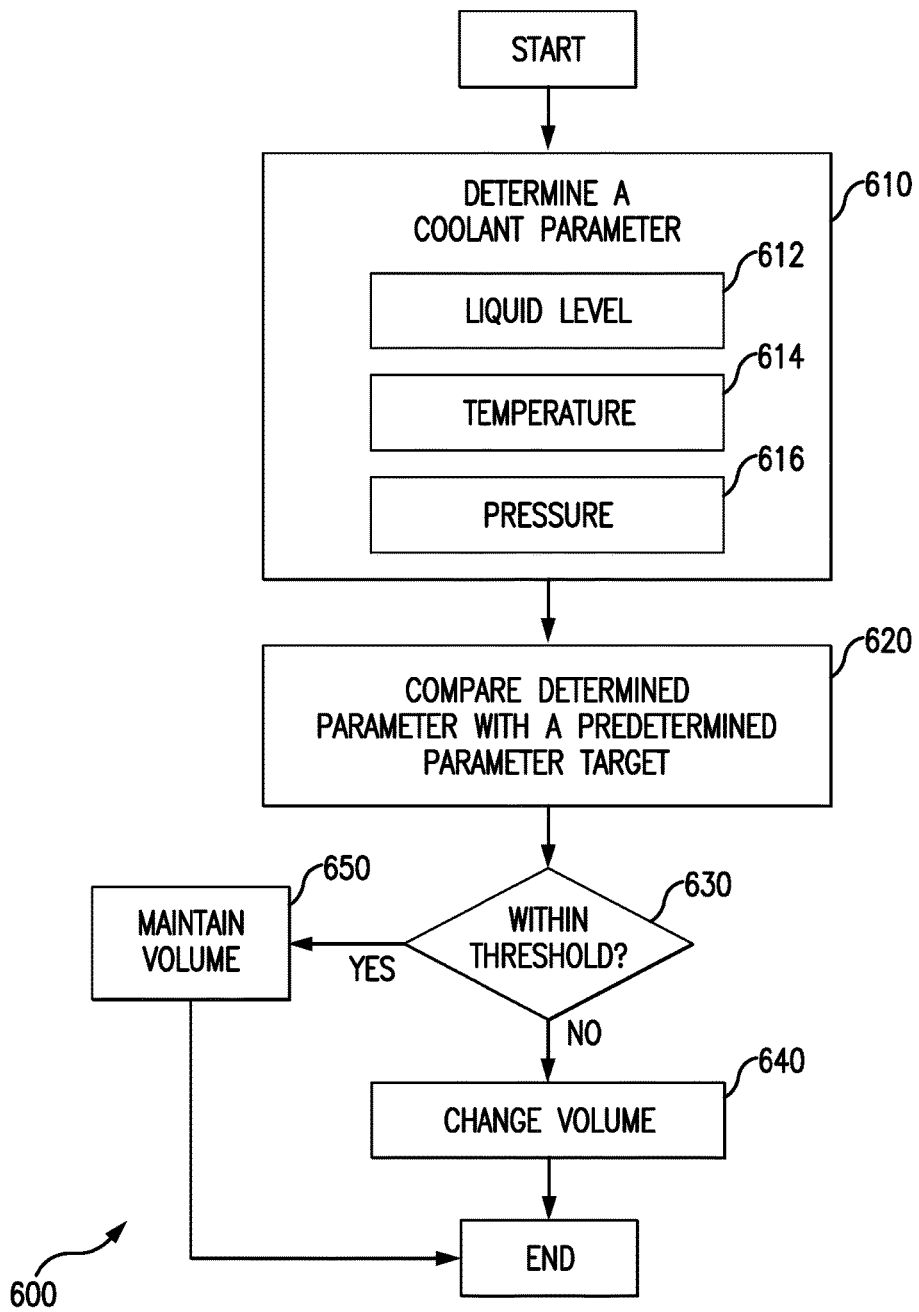
FIG. 4 is a chart of a method of transferring heat between a coolant and electronics in an immersion cooled electronics arrangement, showing steps of the method.

With reference to FIG. 4, a method 600 of transferring heat between a coolant, e.g., coolant 112 (shown in FIG. 2) and an electronic device in an immersion cooling arrangement, e.g., immersion cooled electronics arrangement 102 (shown in FIG. 2) is shown. Method 600 includes determining a parameter, e.g., a liquid level defined by surface 126 (shown in FIG. 2), of the coolant, as shown with box 610. The parameter can be coolant liquid level, as shown with box 612. The parameter can be coolant temperature, as shown with box 614. The parameter can be pressure, as shown with box 616.

The determined parameter is compared with a predetermined parameter target, e.g., a predetermined parameter retained in a program module of a memory within control module 106 (shown in FIG. 1), as shown with box 620. Based on the comparison (shown in box 630), volume of coolant displaced by a variable volume body, e.g., variable volume body 108 (shown in FIG. 2), is increased or decreased when mismatch is above a threshold a predetermined parameter retained in a program module of a memory within control module 106 (shown in FIG. 1), as shown with box 640. Increase or decrease can be by way of electrical communication, e.g., an electrical input 220 (shown in FIG. 3A), mechanical communication, e.g., a mechanical input 320 (shown in FIG. 3B), pneumatic communication, e.g., a pneumatic input 420 (shown in FIG. 3C), or hydraulic communication, e.g., hydraulic input 520 (shown in FIG. 3D). As shown with box 650, the volume of coolant displaced by the variable volume body can be maintained when mismatch is within the threshold, as shown with box 650.

The methods and systems of the present disclosure, as described above and shown in the drawings, provide for immersion cooled electronic devices with superior properties including improved pressure control. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An immersion cooled electronics arrangement, comprising:
   a housing containing a coolant;
   an electronic device submerged within the housing and in thermal communication with the coolant;
   a variable volume body disposed within the housing;
   an actuator operatively connected to the variable volume body and arranged to alter a volume of the coolant displaced by the variable volume body within the housing
   a control module communicative with the actuator; and
   a sensor arranged to provide a parameter of the coolant to the control module, wherein the control module is responsive to instructions recorded on a non-transitory machine-readable medium to:
      determine a parameter of the coolant;
      compare the determined parameter with a predetermined parameter target; and
      when mismatched, change a volume of coolant displaced by the variable volume body based on the comparison.

2. The immersion cooled electronics arrangement as recited in claim 1, wherein the actuator is arranged externally of the housing.

3. The immersion cooled electronics arrangement as recited in claim 1, wherein the actuator is in electrical communication with the variable volume body.

4. The immersion cooled electronics arrangement as recited in claim 1, wherein the actuator is in mechanical communication with the variable volume body.

5. The immersion cooled electronics arrangement as recited in claim 1, wherein the actuator is in pneumatic communication with the variable volume body.

6. The immersion cooled electronics arrangement as recited in claim 1, wherein the actuator is in hydraulic communication with the variable volume body.

7. The immersion cooled electronics arrangement as recited in claim 1, further comprising at least one of (a) an electrical conductor, (b) a mechanical linkage, (c) a pneumatic conduit, and (d) a hydraulic conduit extending through the housing and connecting the actuator with the variable volume body.

8. The immersion cooled electronics arrangement as recited in claim 1, wherein the variable volume body comprises a bellows.

9. The immersion cooled electronics arrangement as recited in claim 1, wherein the coolant comprises a dielectric coolant.

10. The immersion cooled electronics arrangement as recited in claim 1, wherein the housing fluidly isolates the coolant from the external environment.

11. The immersion cooled electronics arrangement as recited in claim 1, further comprising a control module communicative with the actuator.

12. The immersion cooled electronics arrangement as recited in claim 11, further comprising a sensor arranged to provide a coolant parameter to the control module.

13. The immersion cooled electronic arrangement as recited in claim 1, wherein the sealed housing and the coolant define therebetween an ullage space, and further comprising a condenser disposed within the ullage space.

14. The immersion cooled electronic arrangement as recited in claim 1, wherein the electronic device comprises one or more of a capacitor, an inductor, a printed circuit board, a solid-state switch device, heat sink, a solid-state power converter, and a motor controller.

15. The immersion cooled electronic arrangement as recited in claim 1, wherein the instructions cause the control module to take no action when mismatch between the determined parameter and the predetermined parameter target is within a threshold.

16. The immersion cooled electronic arrangement as recited in claim 1, wherein the parameter includes at least one of (a) a liquid level within the housing, (b) pressure within the housing, and (c) coolant temperature.

17. The immersion cooled electronic arrangement as recited in claim 1, wherein the actuator is in (a) electrical communication, (b) mechanical communication, (c) pneumatic communication, or (d) hydraulic communication with the variable volume body.

18. The immersion cooled electronic arrangement as recited in claim 1, further comprising (a) an electrical conductor, (b) a mechanical linkage, (c) a pneumatic conduit, or (d) a hydraulic conduit extending through the housing and connecting the actuator with the variable volume body.

* * * * *